United States Patent
Jeter et al.

(10) Patent No.: US 10,242,723 B1
(45) Date of Patent: Mar. 26, 2019

(54) METHOD AND APPARATUS FOR BACKGROUND MEMORY SUBSYSTEM CALIBRATION

(71) Applicant: Apple Inc., Cupertino, CA (US)

(72) Inventors: Robert E. Jeter, Santa Clara, CA (US); Fabien S. Faure, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/846,992

(22) Filed: Dec. 19, 2017

(51) Int. Cl.
*G11C 7/22* (2006.01)
*G11C 7/10* (2006.01)
*G06F 13/42* (2006.01)

(52) U.S. Cl.
CPC .......... *G11C 7/222* (2013.01); *G06F 13/4234* (2013.01); *G11C 7/1093* (2013.01)

(58) Field of Classification Search
CPC .... G11C 7/222; G11C 7/1093; G11C 11/4076
USPC ................................................. 365/193, 194
See application file for complete search history.

(56) References Cited

U.S. PATENT DOCUMENTS

| | | | |
|---|---|---|---|
| 6,434,081 B1 | 8/2002 | Johnson | |
| 8,228,747 B2 * | 7/2012 | Onishi | G11C 7/1066 365/191 |
| 8,667,347 B2 | 3/2014 | Zerbe | |
| 8,947,140 B2 * | 2/2015 | Iyer | H03L 7/10 327/158 |
| 9,286,961 B1 * | 3/2016 | Jeter | H03L 7/08 |
| 9,425,778 B2 * | 8/2016 | Lee | H03L 7/10 |
| 9,928,890 B2 * | 3/2018 | Jeter | G11C 7/22 |
| 10,082,823 B1 * | 9/2018 | Chang | G06F 1/10 |
| 10,110,210 B2 * | 10/2018 | Bandi | H03K 5/14 |
| 2009/0244996 A1 | 10/2009 | Searles | |
| 2012/0151247 A1 | 6/2012 | Ferraiolo | |
| 2017/0017274 A1 | 1/2017 | Connolly | |

* cited by examiner

*Primary Examiner* — Son L Mai
(74) *Attorney, Agent, or Firm* — Meyertons, Hood, Kivlin, Kowert & Goetzel, P.C.; Erik A. Heter (57) ABSTRACT

A method and apparatus for performing a background calibration in a memory subsystem is disclosed. A memory subsystem includes a memory controller coupled to a memory. The memory controller is coupled to receive data during reads from the memory on a functional data path and a duplicate data path. The memory controller further includes calibration circuitry. During reads of data conducted during normal operation, the calibration circuit calibrates a first delay locked loop (DLL) in the duplicate data path. A second DLL, in the functional data path, may be adjusted based on the calibrations conducted in the duplicate data path.

20 Claims, 6 Drawing Sheets

METHOD AND APPARATUS FOR BACKGROUND MEMORY SUBSYSTEM CALIBRATION

BACKGROUND

Technical Field

This disclosure is directed to memory subsystems, and more particularly, calibration of signals conveyed in memory subsystems.

Description of the Related Art

Eye patterns, or eye diagrams, are graphic illustrations that illustrate times and amplitudes at which a digital signal can be sampled at its correct value. In various types of systems that include data transmissions, sampling of signals (based on a clock signal) near a center of an eye, in terms of time, may be desirable. This may provide a signal with a sufficient amount of both setup and hold time, while also rendering it less susceptible to noise. In sampling a signal, a threshold voltage is used to determine whether the signal is interpreted as a logic 0 or a logic 1.

In memory systems, calibrations may be performed to determine the points at which signals are sampled within the eye pattern. Calibrations may be performed to determine both the point in time at which signals are sampled, as well as to determine the threshold voltage for distinguishing between logic 0's and logic 1's. Performing these calibrations typically includes adjusting a number of different parameters that govern transmission of data between a memory controller and a memory. Such calibrations may be performed on a periodic basis. Additionally, since some systems have multiple operating points (e.g., combinations of clock frequency and supply voltage), calibrations may also be performed upon a switch from one operating point to another.

SUMMARY

A method and apparatus for performing a background calibration in a memory subsystem is disclosed. In one embodiment, a memory subsystem includes a memory controller coupled to a memory. The memory controller is coupled to receive data during reads from the memory on a functional data path and a duplicate data path. The memory controller further includes calibration circuitry. During reads of data conducted during normal operation, the calibration circuit calibrates a first delay locked loop (DLL) in the duplicate data path. A second DLL, in the functional data path, may be adjusted based on the calibrations conducted in the duplicate data path.

In one embodiment, the calibration circuitry may perform periodic calibrations in which the memory subsystem is unavailable for normal data traffic. However, if a sufficient number of reads are performed during normal operation (and thus, a sufficient amount of data to conduct a calibration of the DLL in the duplicate data path), a next instance of the periodically scheduled calibration may be canceled.

The memory controller in one embodiment includes first-in, first-out memories (FIFOs) in each of the functional and duplicate data paths. The calibration circuitry includes comparison circuitry configured to compare data read in the functional data path to data read in the duplicate data path. The results of these comparisons may be used to determine results for the calibrations that are performed during the reads of data conducted while in normal operation.

BRIEF DESCRIPTION OF THE DRAWINGS

The following detailed description makes reference to the accompanying drawings, which are now briefly described.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Figure 1:
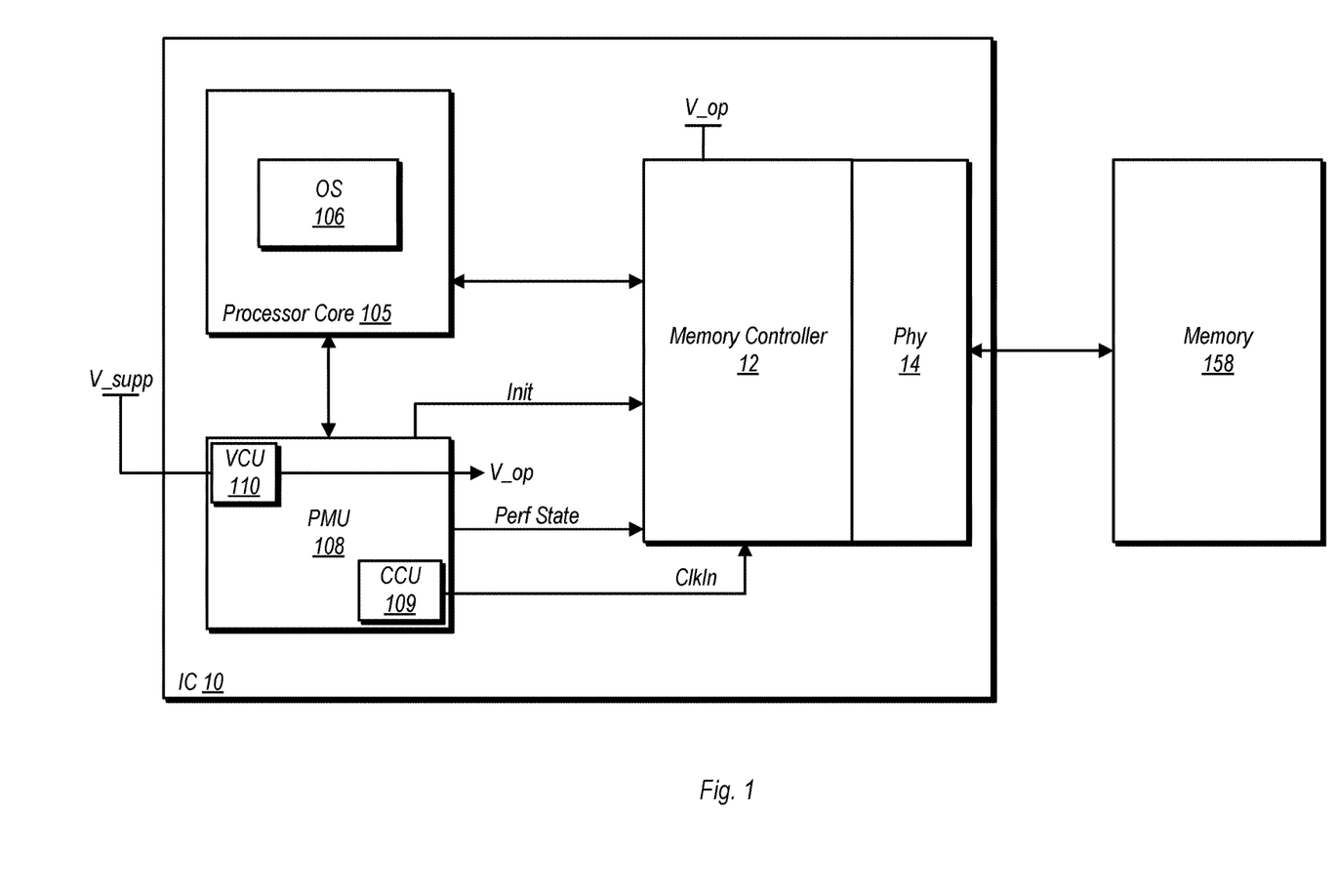
FIG. 1 is a block diagram of one embodiment of an integrated circuit and a memory coupled thereto.

FIG. 1 is a block diagram of one embodiment of an integrated circuit (IC). IC 10 is shown here as a simplified block diagram including various units/circuits implemented thereon. However, other embodiments are possible and contemplated, and may include additional circuits/units not shown here or explicitly discussed herein.

In the embodiment shown, IC 10 is coupled to a memory 158. In one embodiment, memory 158 is a dynamic random access memory (DRAM), although the scope of this disclosure is not limited to DRAM.

IC 10 in the embodiment shown includes at least one processor core 105, although multiple instances of the same may be present. Processor core 105 is configured to execute software instructions, including those of operating system (OS) 105. The instructions of OS 105 may, when executed, cause various system management functions to be performed, such as memory allocation, performance state changes, and so forth.

IC 10 also includes a power management unit (PMU) 108 in the illustrated embodiment. PMU 108 may implement circuitry that performs various power control functions, such as operating voltage changes, power gating, clock frequency changes, and clock gating. These power control functions may be performed in conjunction with performance state changes. Such performance state changes may be put into effect via execution of instructions of OS 105 or through other mechanisms within PMU 108 itself. A performance state (which may also be referred to herein as an operating point) may be defined as combination of an operating voltage and clock frequency. These parameters may be adjusted for desired performance and power savings. For example, if high performance is desired at a given time during operation, the clock frequency and/or the operating voltage may be increased. If reducing power consumption is prioritized at a given time during operation, the clock frequency and/or supply voltage may be reduced. In general, PMU 108 may adjust the clock frequency and operating voltage during operation in an attempt to optimize the amount of performance achieved per watt of power consumed.

PMU 108 in the illustrated embodiment includes a clock control unit (CCU) 109. A clock signal, ClkIn, may be provide from CCU 109 to a memory controller 12 of IC 10. This clock signal may be generated internal to CCU 109, or by other clock generation circuitry external thereto.

PMU 108 in the embodiment shown also includes a voltage control unit (VCU) 110. An external supply voltage, V_supp, is provided to VCU 110. Circuitry within VCU 110 may adjust the voltage output therefrom, V_op, which is the operating voltage supplied to memory controller 12, among other places. PMU 108 may accomplish performance state changes by adjusting the frequency of the clock output from CCU 109, changing the operating voltage, or both.

Memory controller 12, which includes physical interface (PHY) 14, provides an interface between processor core 105 and memory 158. Although not explicitly shown, IC 10 may also include one or more units of interface circuitry that are also coupled to memory controller 12. Accordingly, memory controller 12 may provide an interface for one or more circuits external to IC 10 and memory 158.

During operation, memory controller 12 may operate in a number of different performance states. The different performance states may in turn utilize different frequencies for ClkIn with respect to one another, and different operating voltages as well. In some embodiments, the decision to change the performance state may be made by OS 106. In other embodiments, the decision may be made by PMU 108. In either case, PMU 108 may provide an indication ('Perf State') that a performance state change is pending. Memory controller 12 may use the information of the pending clock frequency change to perform certain actions.

Figure 2:
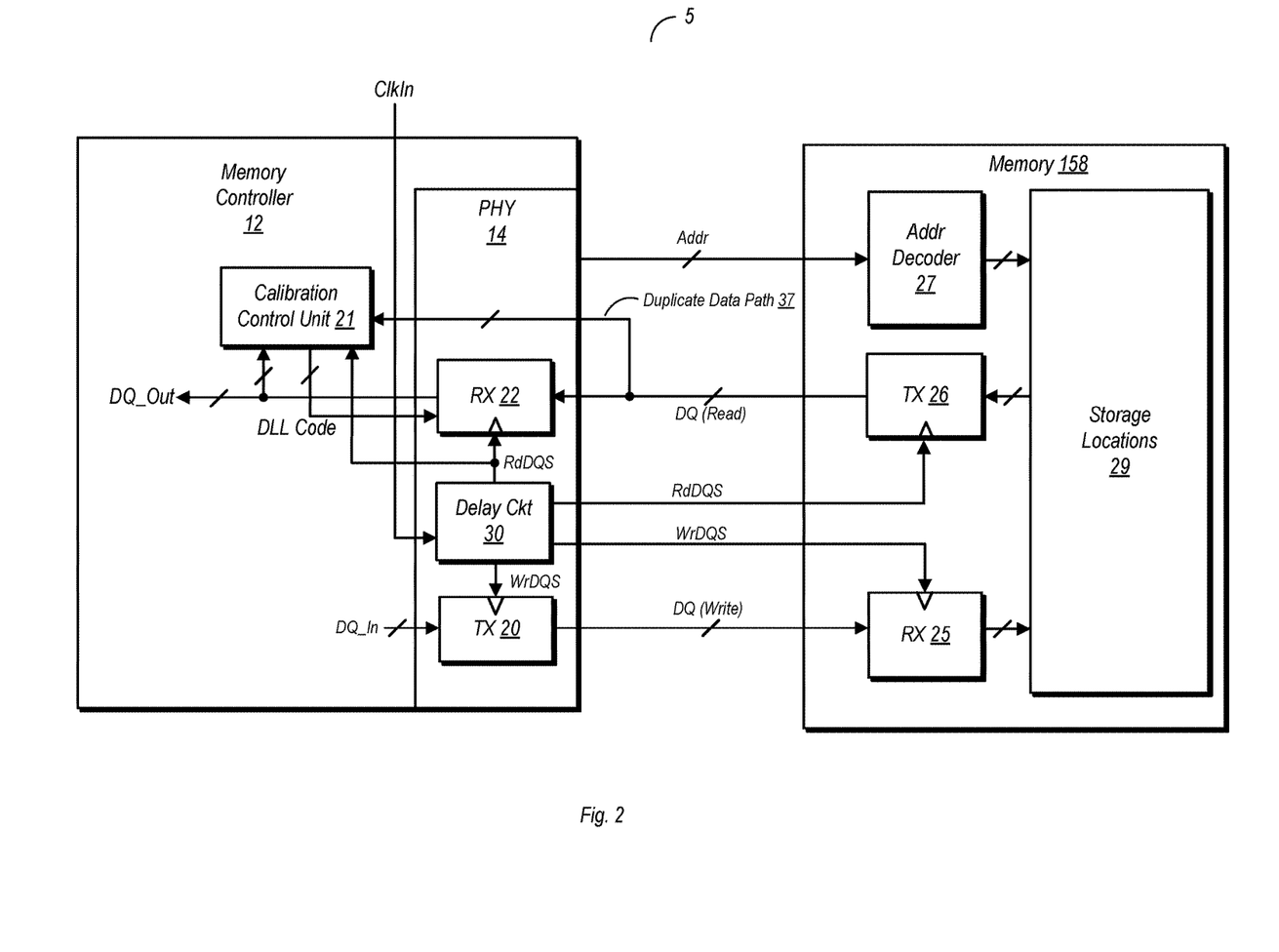
FIG. 2 is a block diagram of one embodiment of a memory subsystem.

Turning now to FIG. 2, a block diagram of a system having a memory controller and a memory is shown. In the embodiment shown, system 5 includes a memory controller 12 and a memory 158. The memory controller 12 includes a physical layer 14 which is used for interfacing with memory 158. The physical layer 14 includes a receiver 22 configured to receive data read from memory 158, and a transmitter 20 configured to transmit data to memory 158.

Memory 158 includes an address decoder 27, a number of storage locations 29, a receiver 25 configured to receive data to be written and a transmitter 26 configured to transmit data that has been read. Although not explicitly shown, memory 158 may include additional logic for receiving read and write enable signals, with such logic being configured to enable selected storage locations for read and write operations, respectively. Additionally, memory controller 12 in the embodiment shown includes calibration control unit 21, which includes circuitry that perform various embodiments of a calibration method discussed below.

Physical layer 14 includes a delay circuit 30 that is coupled to receive an input clock signal ('Clk'). In the embodiment shown, delay circuit 30 may include two separate paths to apply delays to the input clock signal to generate a read data strobe ('RdDQS') and a write data strobe ('WrDQS'). For example, one embodiment of delay circuit 30 may include a pair of delay locked loops (DLLs), one configured to output the read data strobe and one to output the write data strobe. The delays of the respective DLL's may be set according to control signals generated elsewhere in memory controller 12, e.g., in calibration control unit 21. Types of delay circuits other than DLL's are also possible and contemplated for various other embodiments.

Delay circuit 30 may provide the read data strobe to receiver 22 in physical layer 14, as well as to transmitter 26 in memory 158. The read data strobe signal may be used in synchronizing reads of memory 158. The write data strobe may be provided to transmitter 20 of physical layer 14, along with receiver 25 of memory 158. Accordingly, the write data strobe may be used in synchronizing writes to memory 158.

Memory 158 in the embodiment shown includes an address decoder 27 coupled to receive an address from physical layer 14 of memory controller 12. Address decoder 27 may decode the received address to enable particular ones of the storage locations 29 that are to be enabled for a current memory operation. Addresses may be provided from physical layer 14 of memory controller 12 for both read operation and write operations.

A reference voltage calibration may be performed under the control of calibration control unit 21. The reference voltage may be that voltage that is used to distinguish between a logic 0 and a logic 1. Over time, due to process, voltage, and temperature variations, the reference voltage may need to be calibrated. This calibration may also be performed periodically, and may sometimes be referred to as a vertical calibration. Based on the calibration, calibration control unit 21 may set the reference voltage at a reference voltage generator (not shown here). The reference voltage may be provided from to receiver 22.

Calibrations of the data strobe signals are also performed by calibration control unit 21 in the embodiment shown. The data strobe signals provided by delay circuit 30 may be subject to inherent delays, particularly on the side of memory 158. Since the clock edges of the data strobe signals are used to validate data received from memory controller 12 when received by receiver 25 at memory 158, as well as to validate data transmitted from transmitter 26 of memory 158, it is important that setup and hold time requirements for both are observed. Moreover, the data strobe signals used herein are used to synchronize the sampling of multiple bits. Furthermore, the signal paths for conveying bits between memory controller 12 and memory 158 may each be subject to their own unique delays, and thus some inter-lane skew may be present among the data bits. It is desirable that each data signal be sampled at or near the center of a window that may be depicted by an eye diagram. Accordingly, procedures to calibrate the data strobe signals to compensate for inherent delays may be performed at certain times during operation of memory controller 12 in order to optimize the point in time at which the data strobe signals sample data. The calibration procedures may be conducted under the control of calibration control unit 21, and involved performing a number of reads of from memory along with adjustments of an amount of delay applied to the data strobe signal being calibrated. The calibration of the data strobe delay may be performed periodically, and may sometimes be referred to as a horizontal calibration.

It is further noted that the embodiment shown herein is arranged to enable background calibrations of at least the read data strobe signal to be conducted during normal operations, using normal memory traffic. 'Normal operations' may be defined herein as those operations that are carried out in performing the intended functions of the device/system in which the memory subsystem is implemented. For example, if the system is a general purpose computer system, normal operations may be those operations that are performed in executing a software program on the computer system, including writes and reads of data from/to memory 158 respectively. Furthermore, normal operations may be defined as outside of the boundaries of calibration operations, for which the memory subsystem is unavailable to other components in the system/device. Furthermore, normal memory traffic may be defined as data that is conveyed to and from the memory during normal operations, outside of data that is explicitly intended for calibration of the memory subsystem.

In the embodiment shown, the background calibration is partly enabled by the presence of duplicate data path 37, which is coupled to the read path by which data is returned from memory during read operations. Data conveyed on duplicate data path 37 is provided to calibration control unit 21. Additionally, data from the output path of receiver 22 (the 'DQ_out' path) may also be conveyed to calibration control unit 21, along with the read data strobe, RdDQS. As discussed further below, data read by receiver 22 may be compared to data received via duplicate data path 37. Furthermore, calibration control unit 21 may include a separate DLL for which the delays applied to the data strobe may be adjusted. Accordingly, comparisons of the data may be performed to determine if data read by receiver 22 matches that received via the duplicate data path 37. Data read by the duplicate data path 37 may be affected by a delay applied to the read data strobe by the DLL within calibration control unit 21. Based on the comparisons and the delay settings used, calibration control unit 21 may update a DLL code that is then provided to receiver 22, which also includes a DLL in this embodiment.

Figure 3:
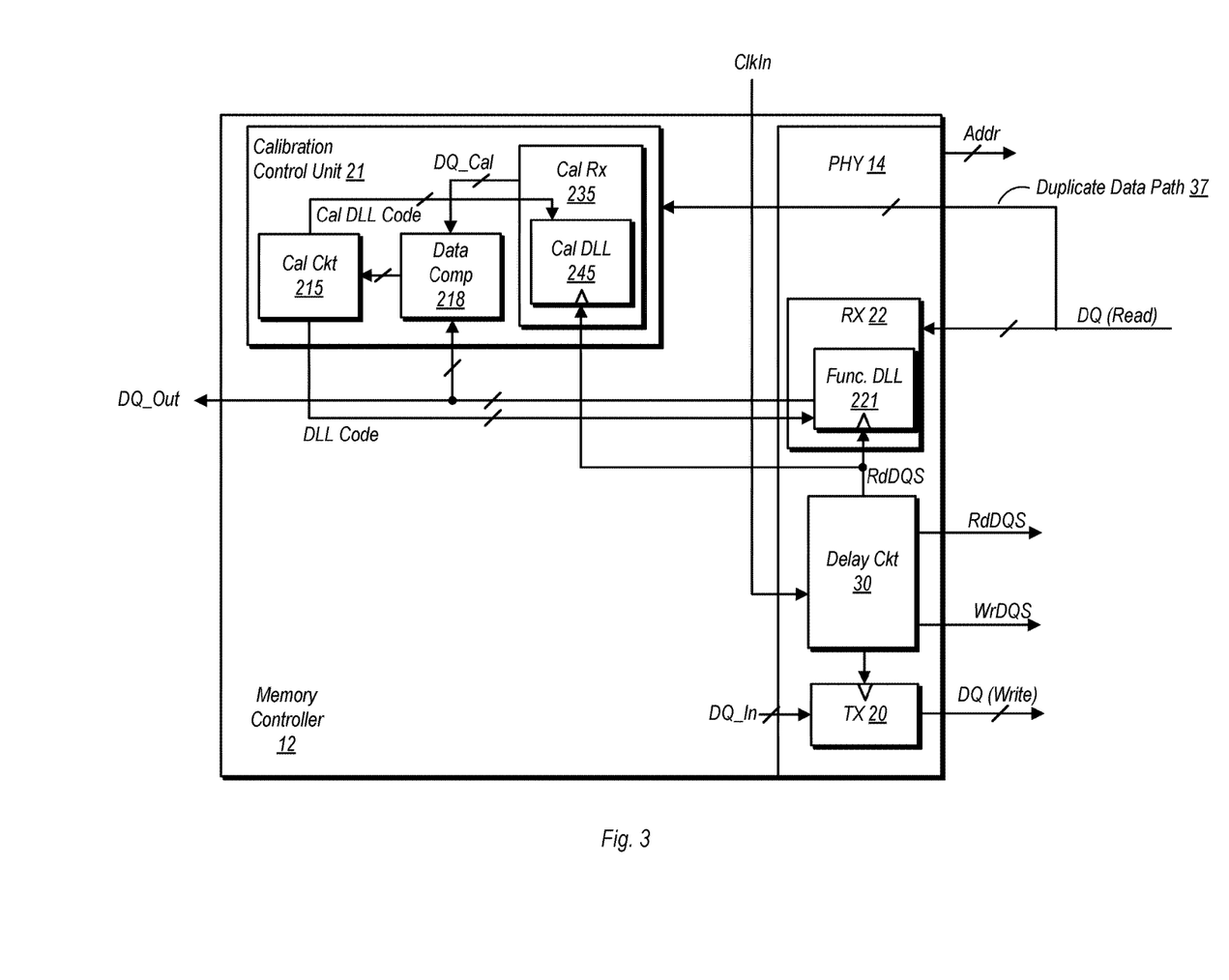
FIG. 3 is a block diagram of one embodiment of a memory controller.

FIG. 3 is a block diagram of one embodiment of a memory controller. In particular, FIG. 3 illustrates further details of one embodiment of a memory controller 12 that may be used in the memory subsystem discussed with reference to FIG. 2.

In the embodiment shown, calibration control unit 21 includes calibration circuit 215, data comparator 218, and a calibration receiver circuit 235. Calibration circuit 215 in the embodiment shown implements circuitry that may include a state machine, and which carries out various calibration functions. Within the calibration receiver circuit is includes a calibration DLL 245, which is coupled to receive a calibration DLL code from calibration circuit 215. Calibration DLL 245 in the illustrated embodiment is provided primarily for calibration purposes and is used primarily in performing calibration procedures. Receiver 22 in the embodiment shown includes a functional DLL 221, which applies a delay to the received read data strobe. Functional DLL 221 in turn outputs a delayed version of the data strobe which is used to synchronize the reading of data received by receiver 22 via the functional data path coupled thereto.

During normal operation, as data is ready by receiver 22 and conveyed on the output data path, DQ_Out, calibration unit 21 may conduct a background calibration. Data conveyed to receive 22 may also be conveyed to calibration receiver 235 via duplicate data path 37. Within receiver 22, the reading of data may be synchronized in accordance with a delayed read data strobe output from functional DLL 221 that is based on the received Rd_DQS signal. Meanwhile, data received by the calibration receiver 235 via duplicate data path may be read in accordance with a delayed data strobe signal output from calibration DLL 245 that is also based on the receive Rd_DQS signal. The data received by both receiver 22 and calibration receiver 235 may be functional data that is intended for another agent (e.g., a processor core) in the system that includes memory controller 12. Calibration circuit 215 may adjust the delay provided to the data strobe signal by calibration DLL 245 on successive reads, while maintaining the delay provided by functional DLL 221. Data that is read by calibration receiver 235 may be provided as calibration data (DQ_Cal) to data comparator 218. Similarly, the data output from receiver 22 on the DQ_Out path is also provided to data comparator 218. These two data sets are then compared with one another, with the results being conveyed to calibration circuit 215. Although not explicitly shown, calibration circuit 215 includes memory (e.g., in the form of registers, SRAM, or other suitable memory type) to store calibration results for each comparison performed.

In addition to performing the background calibrations discussed herein, calibration circuit 215 may also initiate periodically scheduled calibrations in which the memory subsystem is not available. However, if a sufficient number of reads have been performed since a most recent calibration (scheduled or background), calibration circuit 215 may cancel a next periodically scheduled calibration. Accordingly, calibration circuit 215 may track the number of reads performed and an elapsed time since a most recently completed calibration. If the number of reads within a specified time since the most recently scheduled calibration reaches a threshold value, the background calibration completes and calibration circuit 215 may cancel a next periodically scheduled calibration. Otherwise, if the number of reads within the specified time is less than the threshold value, the periodically scheduled calibration may be performed.

In addition to conveying comparison results to calibration circuit 215, data comparator may also examine received data (e.g., from the DQ_Out path) to determine if a sufficient number of logical transitions is performed. This may ensure that data used for performing the background calibration includes a number of logic 1's and a number of logic 0's in each bit position over the number of reads performed to meet or exceed the threshold value. Accordingly, if data comparator 218 reports to calibration circuit 215 that one or more bit positions did not receive a certain number of logical transitions, calibration circuit 215 may carry out the periodically scheduled calibration even if the number of reads performed meets or exceeds the threshold value. Moreover, during the reads, if a particular read of data does not include enough logical transitions from the previous read, the calibration circuit does not update the settings calibration DLL 245 for the next read. Thus, calibration circuit 215 may ensure that both the quantity and quality of data used in performing background calibrations is sufficient to justify canceling of a periodically scheduled calibration.

Upon completing a background calibration, calibration circuit 215 may determine a DLL code to be provided to functional DLL 221. This determination can be made based upon the calibration DLL codes provided to calibration DLL 245. Based on the various codes provided during the background calibration, as well as the comparison results received from data comparator 218, calibration circuit 215 in the embodiment shown determines the width of a data eye. Based on this determination, calibration circuit 215 may select a corresponding DLL code to be provided to functional DLL 221.

A periodically scheduled calibration may be performed in a number of different ways. In one embodiment, a section of memory may be reserved for storing calibration data that can be read therefrom and used as a basis for performing a calibration in a manner similar to that described above (i.e. comparing data as read on the two separate data paths, etc.). In another embodiment, data may be written to memory and read back, with the written data being compared to that which was read.

It is further noted that some periodic calibrations may be performed irrespective of the criteria discussed above for canceling a calibration. In particular, reference voltage ('vertical') calibrations may need to be periodically performed, and thus the memory subsystem may be made temporarily unavailable to perform the same. However, in accordance with the discussion above, the read data strobe calibrations (which are 'horizontal' calibrations) may be performed based on the quality and quantity of data traffic during normal operations. If a sufficient amount of data is read from memory in a specified timeframe, with a sufficient number of transitions in each bit position, then calibration FSM 402 may cancel at least the periodically scheduled calibrations of the read data strobe that would otherwise make the memory subsystem unavailable for normal traffic.

The ability to perform background calibrations may provide performance benefits over embodiments in which only periodically scheduled calibrations are performed. In particular, during times of high memory traffic, the amount and quality of data may often times be sufficient to cancel a number of periodically scheduled calibrations. This in turn may increase the availability of the memory subsystem, thereby reducing the performance impact of performing calibrations. In times of low memory traffic, the performing of periodically scheduled calibrations does not have as significant of an impact on performance, as less availability of the memory subsystem is required.

Figure 4:
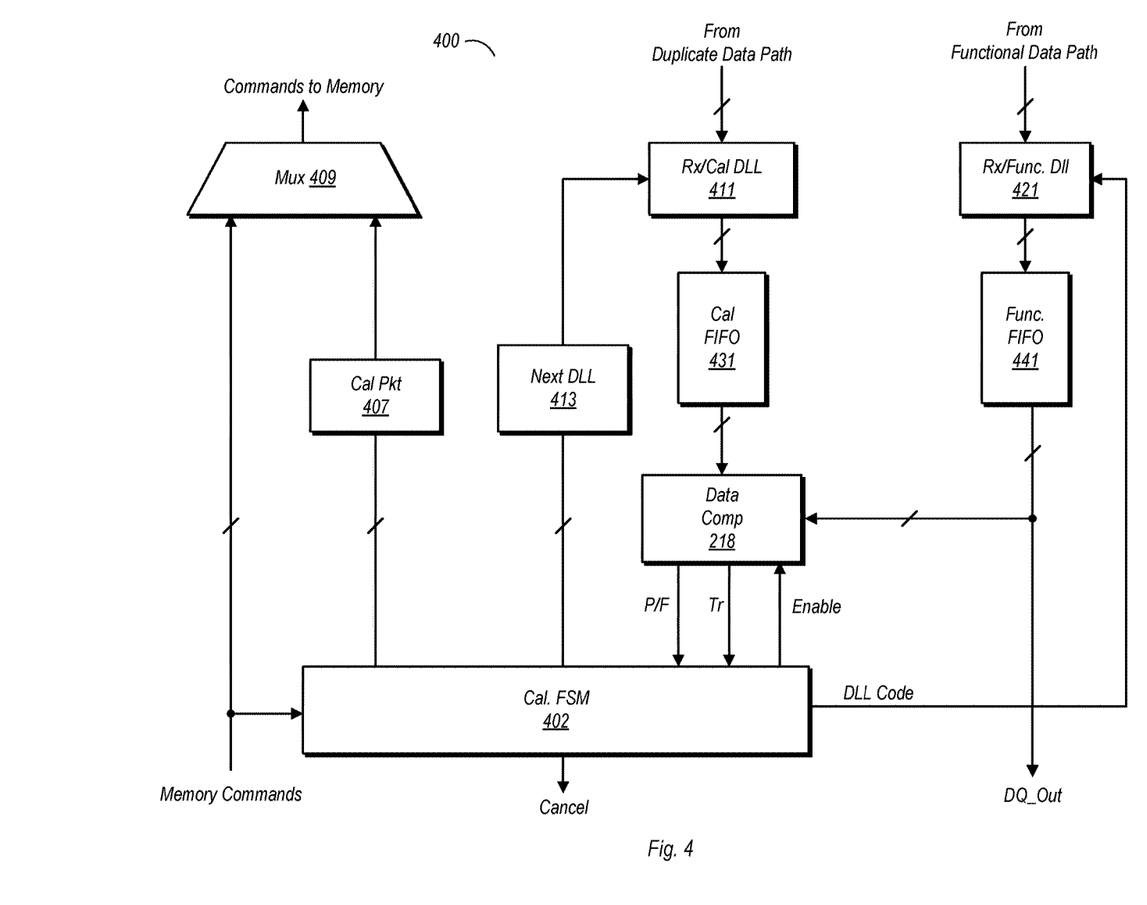
FIG. 4 is a block diagram illustrating one embodiment of an apparatus for performing a background calibration in a memory subsystem.

FIG. 4 is a block diagram illustrating one embodiment of an apparatus for performing a background calibration in a memory subsystem. In one embodiment, system 400 as shown herein may be implemented within the framework of memory controller 12 as shown in FIG. 3. However, it is possible and contemplated that system 400 may be implemented in other apparatus embodiments not explicitly discussed herein.

Conducting a calibration in system 400 includes a calibration finite state machine (FSM) enabling a comparator circuit to compare data from two different sources. In the embodiment shown, system 400 includes a receiver/calibration DLL 411 coupled to a duplicate data path and a receiver/functional DLL 421 coupled to a functional data path. These two data paths may be coupled to a memory and may initially receive the same data from the memory coupled thereto. Data received in their respectively coupled data paths may be read and forwarded to correspondingly coupled first-in, first-out memories (FIFOs). Calibration FIFO 431 is coupled to receive data read by receiver/calibration DLL 411, while functional FIFO 441 is coupled to receive data from receiver/functional DLL 421. Data output from these two FIFOs may be forwarded to comparator circuit 218, which compares the data from the two sources and provides pass/fail ('P/F') to calibration FSM 402. Additionally, comparator circuit 218 may also provide transition information ('Tr') indicative of logical transitions in the various bit positions of the data being compared.

Between reads of data, calibration FSM 402 may update the delay settings of the calibration DLL in receiver/calibration DLL 411. A DLL code is provided from calibration FSM 402 to Next DLL register 413, after which it is forwarded to the calibration DLL prior to conducting the next read of data. Upon completing a full calibration (either background or periodically scheduled), calibration FSM 402 may provide a DLL code to the functional DLL in order to update its delay settings.

In some instances, the amount of data traffic necessary to meet the threshold for canceling a periodically scheduled calibration may be near, but short of the threshold. Calibration FSM may, in at least some cases, send calibration packets to the memory to cause additional reads that enable the meeting of the threshold. These calibration packets may include read commands, and are conveyed to calibration packet register 407. From there, calibration FSM may cause calibration multiplexer 409 to select the output of calibration packet register 407 to be conveyed to the system memory. This may continue until a sufficient amount of data has been read to enable canceling of the next periodically scheduled calibration (by assertion of the 'Cancel' signal). When not conveying packets to memory, calibration FSM 402 may cause multiplexer 409 to select an alternate source (e.g., another unit within a memory controller) con convey commands to memory.

Figure 5:
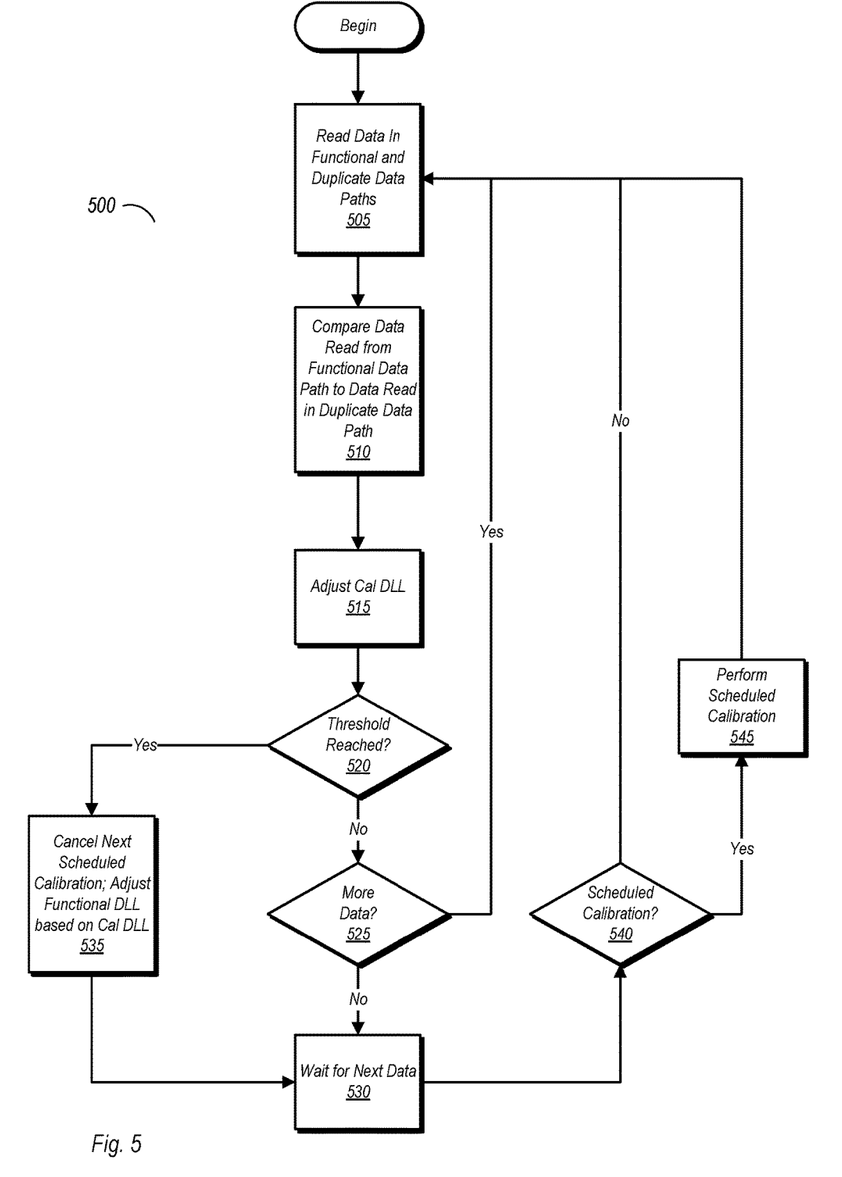
FIG. 5 is a flow diagram of one embodiment for performing a background calibration in a memory subsystem.

FIG. 5 is a flow diagram illustrating one embodiment of a method for performing a background calibration in a memory subsystem. Method 500 may be performed by any of the various apparatus embodiments discussed above. It is further contemplated that method 500 may be performed by apparatus embodiments not explicitly discussed herein. Such embodiments may nonetheless fall within the scope of this disclosure.

Method 500 begins with the reading of data conveyed from memory on both a functional data path and a duplicate data path (block 505). The reading of the data may be conducted during normal operations, e.g., when the data is being read at the request of another agent, such as a processor core. The data provided to the requesting agent may be that data that is received from the functional data path. The data conveyed on the duplicate data path (which comes from the same source as the data conveyed on the functional data path) may be received by, e.g., calibration circuitry. The data received from the functional data path may be read by a receiver in the memory controller and be subsequently conveyed to the requesting agent. Moreover, the data received by the functional data path may be read in accordance with a delayed data strobe signal output from a functional DLL in the receiver. Meanwhile, the data received by the calibration circuitry may be read in accordance with another delayed data strobe signal output from a calibration DLL implemented within the calibration circuitry. Since the timing of reading the data from the functional data path may be different from that conveyed on the duplicate data path, it is possible that in at least some instances that the two sets of data may not match.

Data read from the functional data path may be compared to data read in the duplicate data path (block 510). The comparison of data also includes checking the number of logical transitions in the data. Results of the comparison (e.g., pass if the data sets match, fail if one or more bits of the data sets are different) may be recorded. Between each read of data, calibration circuitry may adjust the calibration DLL if there were enough logical transitions from the most recent data read (block 515). For example, calibration circuitry may provide a DLL code to the calibration DLL to adjust an amount of delay provided thereby. This in turn affects the synchronizing of reads of data received in the duplicate data path.

If the amount of data read since the most recent calibration (or within a specified time frame, or both) has not reached a threshold value (block 520, no), and more data is read (block 520, yes), then the method returns to block 505. Another read of data is conducted, a comparison is made, and the calibration DLL is again adjusted. This loop may be repeated a number of times, particularly during times when a significant amount of data is being read from memory.

If the amount of data read has reached a threshold since the previous calibration or within a specified time period (block 520, yes), the background calibration completes, the next periodically scheduled calibration may be canceled, and the functional DLL may be adjusted based on the settings of the calibration DLL (block 535). From there, method 400 waits for the next read of data (block 530). If no scheduled calibration is to be performed (block 540, no), method 400 returns to block 505.

If no further data is currently available for reading (block 525, no), the apparatus may wait for a next read of data. If the threshold for the amount of data read from the memory is not reached, and a calibration is scheduled (block 540, yes), then the scheduled calibration is performed (block 545). The method may then return to block 505 when the calibration is complete and data from a next read is available.

Figure 6:
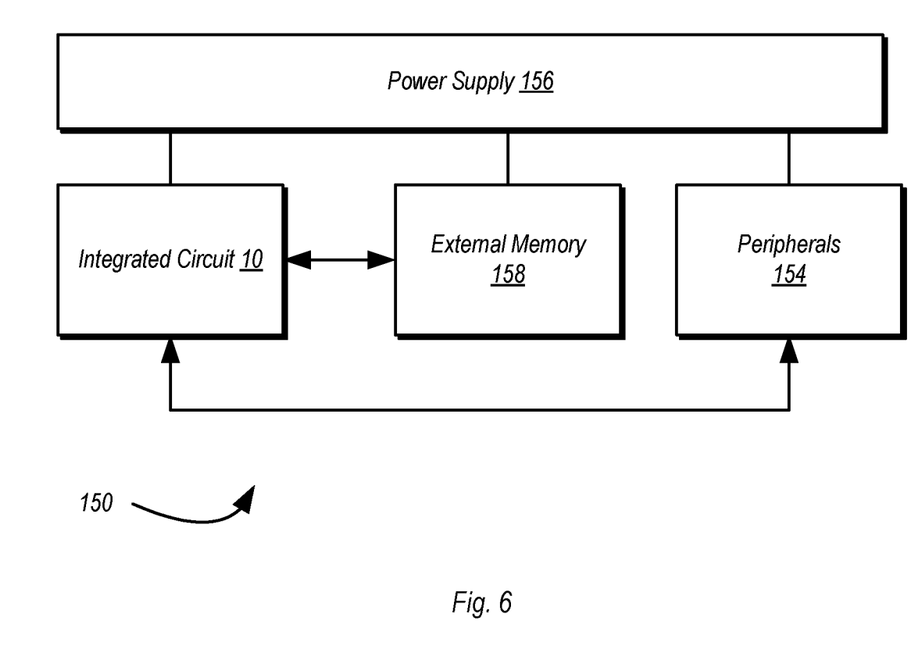
FIG. 6 is a block diagram of one embodiment of an exemplary system.

Turning next to FIG. 6, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
a memory subsystem including a memory and a memory controller coupled to the memory, wherein the memory controller is configured to convey a data strobe signal to the memory during transfers of data to and from the memory, wherein the memory controller is coupled to receive data from the memory via a functional data path and a duplicate data path;
wherein the memory controller includes calibration circuitry configured to:
calibrate a first delay locked loop (DLL) in the duplicate data path using the data read from the memory during normal operation; and
adjust a second DLL in the functional data path based on results from calibrating the first DLL.

2. The apparatus as recited in claim 1, wherein the calibration circuitry is configured to cancel a periodically scheduled calibration responsive to determining that an amount of data read from the memory exceeds a threshold value, wherein the memory subsystem is unavailable for normal memory traffic during the periodically scheduled calibration.

3. The apparatus as recited in claim 1, wherein the calibration circuit includes comparison circuitry configured to compare the data as read in the duplicate data path to the data as read in the functional data path.

4. The apparatus as recited in claim 3, wherein the memory controller includes a first first-in, first out memory (FIFO) in the duplicate data path, and a second FIFO in the functional data path, wherein the comparison circuitry is coupled to receive data from each of the first and second FIFOs.

5. The apparatus as recited in claim 1, wherein the calibration circuitry includes a finite state machine configured to determine a first delay applied to a data strobe signal by the first DLL.

6. The apparatus as recited in claim 5, wherein the finite state machine is configured to, upon completing a calibration, a second delay applied to a data strobe signal by the second DLL.

7. The apparatus as recited in claim 1, wherein the calibration circuitry is further configured to convey calibration commands to the memory.

8. The apparatus as recited in claim 7, wherein responsive to a calibration command received from the calibration circuitry, the memory is configured to convey data, to the memory controller, from a reserved set of addresses.

9. The apparatus as recited in claim 1, wherein the calibration circuitry is configured to calibrate the first DLL based on a plurality of reads of data from the memory conducted during normal operation, and wherein the calibration circuitry is configured to vary a delay value applied by the first DLL on successive reads of data.

10. A method comprising:
a memory controller reading data from a memory in a memory subsystem during normal operations, wherein reading data from the memory comprises conveying data on a functional data path and a duplicate data path;
calibrating, using calibration circuitry implemented in the memory controller, a first delay locked loop (DLL) in the duplicate data path based on the data read from the memory during normal operations; and
adjusting a second DLL in the functional data path based on results from calibrating the first DLL.

11. The method as recited in claim 10, wherein calibrating includes comparing the data as conveyed in the duplicate data path to the data as conveyed in the functional data path.

12. The method as recited in claim 10, wherein reading data from the memory comprises conveying the data to a first first-in, first-out memory (FIFO) in the duplicate data path, and a second FIFO in the functional data path, and wherein comparing comprises comparing data output from the first FIFO to data output from the second FIFO.

13. The method as recited in claim 10 further comprising the calibration circuitry canceling a periodically scheduled calibration responsive to determining that an amount of data read from the memory since a previous calibration exceeds a threshold value, wherein the memory subsystem is unavailable for normal memory traffic during the periodically scheduled calibration.

14. The method as recited in claim 10, wherein calibrating comprises a finite state machine causing, in the duplicate data path, adjustments to a first delay applied to a data strobe signal by the first DLL.

15. The method as recited in claim 14, further comprising the finite state machine, upon completing a calibration, setting a second delay applied to the data strobe signal by the second DLL.

16. The method as recited in claim 10, wherein calibrating comprises performing successive reads of memory and further includes the calibration circuitry causing varying of a delay applied to a data strobe signal provided by the first DLL on each successive read of data from memory.

17. A system comprising:
a memory; and
a memory controller coupled to the memory, wherein, during reads of data from the memory, the memory controller is coupled to received data from the memory via a functional data path and a duplicate data path, wherein the duplicate data path includes a first delay locked loop (DLL) and the functional data path includes a second DLL;
wherein the memory controller includes a calibration circuit configured to:
perform calibrations in the duplicate data path during normal reads of data from the memory, wherein data read from memory is conveyed on both the functional data path and the duplicate data path, and wherein performing the calibrations includes adjusting, in the duplicate data path, a first reference voltage and a first delay applied by the first DLL to a data strobe signal received in the duplicate data path; and upon completion of a calibration, adjust, in the functional data path, a second reference voltage and a second delay applied by the second DLL to the data strobe signal.

18. The system as recited in claim 17, wherein the calibration circuit comprises:
   a first first-in, first-out memory (FIFO) in the duplicate data path;
   a second FIFO in the functional data path, wherein, responsive to a read of the memory, each of the first and second FIFOs are coupled to receive data returned during the read;
   a comparator circuit coupled to compare data received from the first FIFO with data received from the second FIFO; and
   a finite state machine coupled to receive comparison results from the comparator circuit, and configured to make adjustments to at least one of the first reference voltage and the first delay for successive reads of data from the memory.

19. The system as recited in claim 18, wherein the finite state machine is further configured to cancel a scheduled calibration responsive to determining that an amount of data received during normal reads from memory, since a previous calibration, wherein the memory is unavailable for normal data traffic during a scheduled calibration.

20. The system as recited in claim 18, wherein the finite state machine is configured to convey calibration commands to the memory, wherein, responsive to receiving calibration commands, the memory is configured to convey data, to the memory controller, from a reserved set of addresses.

* * * * *